United States Patent
Lee et al.

(10) Patent No.: US 9,752,252 B1
(45) Date of Patent: Sep. 5, 2017

(54) CUBIC PHASE, NITROGEN-BASED COMPOUND SEMICONDUCTOR FILMS

(71) Applicants: Seung-Chang Lee, Albuquerque, NM (US); Steven R. J. Brueck, Albuquerque, NM (US)

(72) Inventors: Seung-Chang Lee, Albuquerque, NM (US); Steven R. J. Brueck, Albuquerque, NM (US)

(73) Assignee: STC.UNM, Albuquerque, NM (US)

(*) Notice: Subject to any disclaimer, the term of this patent is extended or adjusted under 35 U.S.C. 154(b) by 0 days.

(21) Appl. No.: 15/272,153

(22) Filed: Sep. 21, 2016

Related U.S. Application Data

(60) Continuation of application No. 14/826,925, filed on Aug. 14, 2015, now Pat. No. 9,461,112, which is a division of application No. 13/670,391, filed on Nov. 6, 2012, now Pat. No. 9,153,431, which is a continuation of application No. 12/691,463, filed on Jan. 21, 2010, now Pat. No. 8,313,967.

(60) Provisional application No. 61/146,034, filed on Jan. 21, 2009.

(51) Int. Cl.
| | |
|---|---|
| C30B 25/04 | (2006.01) |
| H01L 29/20 | (2006.01) |
| H01L 27/12 | (2006.01) |
| C30B 29/40 | (2006.01) |
| C30B 25/18 | (2006.01) |

(52) U.S. Cl.
CPC ............ C30B 25/04 (2013.01); C30B 25/18 (2013.01); C30B 29/406 (2013.01); H01L 27/1222 (2013.01); H01L 29/2003 (2013.01)

(58) Field of Classification Search
CPC ....... C30B 25/04; C30B 25/18; C30B 29/406; H01L 29/2003; H01L 27/1222
See application file for complete search history.

(56) References Cited

U.S. PATENT DOCUMENTS

| | | | |
|---|---|---|---|
| 4,999,314 A | 3/1991 | Pribat et al. | |
| 6,252,261 B1* | 6/2001 | Usui | B82Y 20/00 257/190 |
| 6,261,929 B1* | 7/2001 | Gehrke | H01L 21/0237 257/E21.123 |
| 6,358,316 B1 | 3/2002 | Kizuki et al. | |
| 6,403,451 B1* | 6/2002 | Linthicum | H01L 21/0237 257/E21.125 |

(Continued)

OTHER PUBLICATIONS

Lee et al., "Phase control of GaN on Si by nanoscale faceting in metalorganic vapor-phase epitaxy," Journal of Crystal Growth, 272 (2004), pp. 2-8.

(Continued)

*Primary Examiner* — Evan Pert
(74) *Attorney, Agent, or Firm* — MH2 Technology Law Group LLP

(57) ABSTRACT

A method of epitaxially growing nitrogen-based compound semiconductor thin films on a semiconductor substrate, which is periodically patterned with grooves. The method can provide an epitaxial growth of a first crystalline phase epitaxial film on the substrate, and block the growth of an initial crystalline phase with barrier materials prepared at the sides of the grooves. Semiconductor devices employing the epitaxial films are also disclosed.

16 Claims, 8 Drawing Sheets

(56) References Cited

U.S. PATENT DOCUMENTS

| | | | | |
|---|---|---|---|---|
| 6,468,347 B1* | 10/2002 | Motoki | .................. | C30B 25/02 |
| | | | | 117/106 |
| 6,489,221 B2* | 12/2002 | Gehrke | .............. | H01L 21/0242 |
| | | | | 257/E21.113 |
| 7,354,477 B2* | 4/2008 | Motoki | .................. | C30B 23/02 |
| | | | | 117/101 |
| 7,473,315 B2* | 1/2009 | Nakahata | ................ | C30B 23/02 |
| | | | | 117/84 |
| 7,790,045 B1 | 9/2010 | Chuang et al. | | |
| 8,212,259 B2* | 7/2012 | Flynn | ..................... | C30B 23/00 |
| | | | | 257/615 |
| 8,313,967 B1* | 11/2012 | Lee | .................. | H01L 21/02381 |
| | | | | 257/200 |
| 9,153,431 B1 | 10/2015 | Lee et al. | | |
| 9,461,112 B1* | 10/2016 | Lee | .................. | H01L 21/02381 |
| 2004/0183078 A1* | 9/2004 | Wang | ................. | H01L 21/0237 |
| | | | | 257/74 |
| 2006/0292719 A1* | 12/2006 | Lochtefeld | ........ | H01L 21/02381 |
| | | | | 438/22 |
| 2007/0267722 A1* | 11/2007 | Lochtefeld | ........ | H01L 21/02381 |
| | | | | 257/618 |
| 2011/0049568 A1* | 3/2011 | Lochtefeld | ........ | H01L 21/02381 |
| | | | | 257/190 |
| 2011/0062492 A1* | 3/2011 | Ko | .................... | H01L 21/76224 |
| | | | | 257/190 |
| 2015/0108427 A1* | 4/2015 | Brueck | ............. | H01L 21/02381 |
| | | | | 257/14 |
| 2017/0033186 A1* | 2/2017 | Han | ........................ | H01L 29/20 |

OTHER PUBLICATIONS

Lee et al., "Nanoscale spatial phase modulation of GaN on a V-Grooved Si substrate—Cubic Phase GaN on Si(001) for Monolithic Integration," IEEE Journal of Quantum Electronics, vol. 41, No. 4, Apr. 2005, pp. 596-605.

Lee et al., "Spatial phase separation of GaN selectively grown on a nanoscale faceted Si surface," Applied Physics Letters, vol. 84, No. 12, Mar. 22, 2004, pp. 2079-2081.

* cited by examiner

CUBIC PHASE, NITROGEN-BASED COMPOUND SEMICONDUCTOR FILMS

RELATED APPLICATIONS

This application is a continuation of U.S. patent application Ser. No. 14/826,925 filed Aug. 14, 2015 (now allowed), which is a divisional of U.S. patent application Ser. No. 13/670,391, filed Nov. 6, 2012 (now U.S. Pat. No. 9,153,431 issued Oct. 6, 2015), which is a continuation of U.S. patent application Ser. No. 12/691,463, filed Jan. 21, 2010 (now U.S. Pat. No. 8,313,967 issued Oct. 31, 2012), which claims U.S. domestic priority under 35 U.S.C. 119 to provisional application No. 61/146,034, filed Jan. 21, 2009, both of which applications are herein incorporated by reference in their entirety.

FEDERALLY SPONSORED RESEARCH

This invention was made with government support under Contract No. HR0011-05-1-0006 awarded by the Defense Advanced Research Projects Agency (DARPA). The U.S. Government has certain rights in this invention.

FIELD OF THE INVENTION

This invention relates to the field of semiconductor manufacture, and more particularly for a method and structure used to form an epitaxial layer over a semiconductor substrate.

BACKGROUND OF THE INVENTION

Epitaxial layers (epilayers) formed over a semiconductor substrate are useful as a material in the engineering, development, and production of semiconductor devices. Interest in Nitrogen-based semiconductors such as gallium nitride (GaN), indium nitride (InN), and indium gallium nitride ($In_xGa_{1-x}N$) is increasing in the field of semiconductor device physics. A bandgap corresponding to optical emission from these nitrogen-based compound semiconductors covers the wavelengths ranging from ultraviolet to infrared light, implying potential for application to photonics and high-power electronics. Generally, these semiconductors have two crystal structures: hexagonal (wurzite) phase and cubic phase. While the crystal structure formed depends on growth conditions and substrate crystal structures and orientations, hexagonal phase thin films are generally energetically more stable and have better quality than cubic phase films. However, the preference for hexagonal phase thin films is largely due to the constraints of current epitaxy technologies, and these are therefore more widely used in semiconductor industries.

Cubic phase nitrogen-based compound semiconductor materials have many important and interesting characteristics which are potentially superior to those of hexagonal phase materials for device applications. These qualities include a high electron mobility, higher electrical activation in p-type heavy doping, improved ohmic electrical contacts and cleaving along {110} faces for fabricating the mirror facets of laser diodes, and elimination of the built-in field associated with strain and the piezoelectric effect found with the commonly used crystal planes of wurzite films. Furthermore, cubic phase GaN on Si (001) which is the most common substrate orientation, and the ready availability of inexpensive, large-area (300 mm diameter), nearly defect free silicon {001} substrates, could impact semiconductor industries as a result of the possible integration of GaN-related devices with silicon microelectronics. For simplicity of notation and without any loss of generality, we take the z-direction to be normal to and pointing away from the substrate top surface.

A method for forming a cubic phase, nitrogen-based compound semiconductor film using epitaxy, and a resulting semiconductor device comprising the structure, would be desirable.

SUMMARY OF THE EMBODIMENTS

Present embodiments provide methods for forming epitaxial cubic phase materials on semiconductor substrates and devices incorporating these epitaxial cubic phase materials.

In an embodiment of the invention, a method for forming an epitaxial layer comprises forming a groove in a semiconductor substrate and growing an epitaxial layer in the groove of the substrate. The epitaxial layer can comprise a first crystal structure and a second crystal structure different from the first crystal structure. During the growing of the epitaxial layer, growth of the first crystal structure can be blocked with a mask structure. The second crystal structure can be grown through an opening in the mask structure.

In another embodiment, a method of forming a semiconductor device comprises forming a groove within a semiconductor substrate, forming a mask structure comprising an overhang structure and an opening therein over the semiconductor substrate, and growing an epitaxial layer from the groove in the semiconductor substrate. The epitaxial layer comprises hexagonal phase material and cubic phase material. Growth of the hexagonal phase material is blocked with the overhang structure, wherein the cubic phase material grows through the opening in the mask layer.

In another embodiment, a semiconductor device comprises a semiconductor substrate having a groove therein, a mask layer having an opening therein overlying the semiconductor substrate, and an epitaxial layer comprising a first crystal structure and a second crystal structure different from the first crystal structure. The second crystal structure extends through the opening in the mask layer.

Another embodiment or the present disclosure is directed to a method of forming a semiconductor device. The method comprises forming a plurality of grooves within a semiconductor substrate; forming a mask structure comprising a plurality of openings therein over the semiconductor substrate wherein the plurality of openings are aligned with the plurality of grooves; growing a nitrogen-based compound semiconductor epitaxial layer from each of the plurality of grooves in the semiconductor substrate, the epitaxial layer comprising a first crystal phase and a second crystal phase; and blocking the first crystal phase material with the sidewalls of the mask structure, wherein at least a portion of the second crystal phase material grows through each of the plurality of openings in the mask structure.

In another embodiment, the present disclosure is directed to a method of forming a semiconductor device. The method comprises forming a plurality of grooves within a semiconductor substrate; forming a mask structure comprising a plurality of openings therein over the semiconductor substrate wherein the plurality of opening are aligned with the plurality of grooves; growing an epitaxial layer from each of the plurality of grooves in the semiconductor substrate, wherein the epitaxial layer comprises hexagonal phase material and cubic phase material; blocking growth of the hexagonal phase material with a portion of the mask structure, wherein the cubic phase material grows through each of the plurality of openings in the mask structure; stopping the growth of the cubic phase material; forming a planarization material over an upper surface of the cubic phase material; removing a portion of the planarization material; forming a mask having openings over the planarization material, wherein the openings are spaced a lateral distance from each of the plurality of grooves; etching the planarization material through the mask openings to form a space between a surface of the mask structure and the mask; further growing the cubic phase material to at least partially fill the space between the first mask layer and the second mask layer; and removing the second mask layer to expose the cubic phase material.

In another embodiment, the present disclosure is directed to a method of forming a semiconductor device. The method comprises forming a plurality of grooves within a semiconductor substrate; forming a mask structure comprising a plurality of openings therein over the semiconductor substrate wherein the plurality of opening are aligned with the plurality of grooves; growing an epitaxial layer from each of the plurality of grooves in the semiconductor substrate, wherein the epitaxial layer comprises hexagonal phase material and cubic phase material; blocking growth of the hexagonal phase material with a portion of the mask structure, wherein the cubic phase material grows through each of the plurality of openings in the mask structure; and covering an upper surface of the mask layer with lateral growth of the cubic phase material, wherein the crystal growth is stopped before complete coalescence so as to form a plurality of island films.

In another embodiment, the present disclosure is directed to a semiconductor device. The semiconductor device comprises a plurality of grooves within a semiconductor substrate; a mask structure comprising a plurality of openings therein over the semiconductor substrate wherein the plurality of opening are aligned with the plurality of grooves, the mask structure comprising a single layer; an epitaxial layer in each of the plurality of grooves in the semiconductor substrate, wherein the epitaxial layer comprises hexagonal phase material and cubic phase material, the cubic phase material extending through each of the plurality of openings in the mask structure, growth of the hexagonal phase material having been blocked by the mask structure in a manner so that the hexagonal phase material does not extend above the mask structure.

BRIEF DESCRIPTION OF THE DRAWINGS

The accompanying drawings, which are incorporated in and constitute a part of this specification, illustrate embodiments of the invention and together with the description, serve to explain the principles of the invention. In the figures.

It should be noted that some details of the FIGS. have been simplified and are drawn to facilitate understanding of the inventive embodiments rather than to maintain strict structural accuracy, detail, and scale.

DESCRIPTION OF THE EMBODIMENTS

Reference will now be made in detail to the present embodiments (exemplary embodiments) of the invention, examples of which are illustrated in the accompanying drawings. Wherever possible, the same reference numbers will be used throughout the drawings to refer to the same or like parts.

Cubic phase GaN can be formed in an epilayer grown on a V-shaped groove fabricated in a silicon (001) substrate, said V-shaped groove can be aligned with the substrate to expose {111} sidewalls. A GaN epilayer grown in a single groove has both cubic and hexagonal phases which are spatially separated from each other along a boundary parallel to the grooved surface. In epitaxial growth, the first to second phase transformation in crystal structure is available when an epilayer has the property of polytypism. Depending on the growth condition and a given pattern on a substrate, such phase transformation is driven by the minimization of the internal energy of a crystal that is determined by phase structure. In GaN, phase transformation from, for example hexagonal (first) to cubic (second) crystal structure occurs on a {111} side wall, V-shaped grooved substrate.

Figure 1:
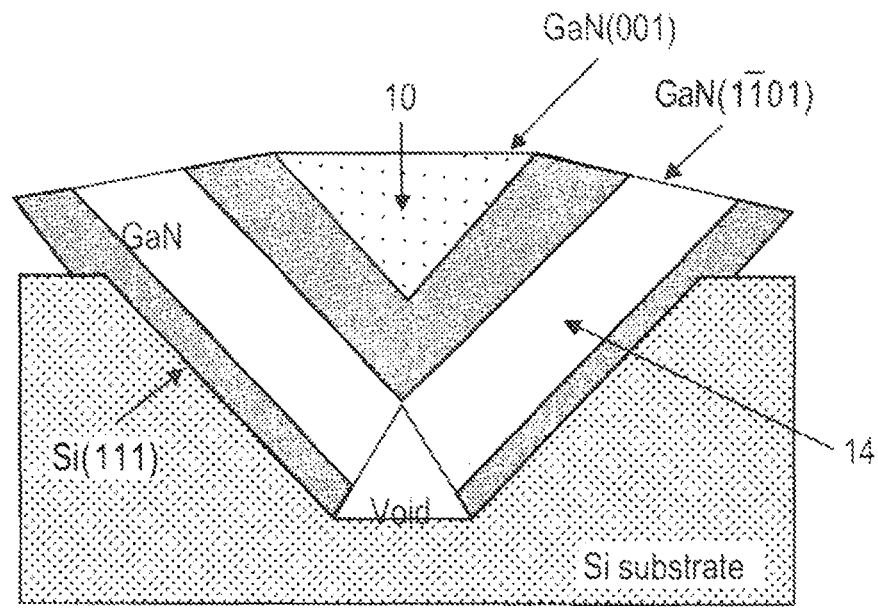
FIG. 1 is a material phase map of a cross section of a transmission electron microscope (XTEM) image of a single groove of a 75-nm thick as-grown GaN sample depicting regions of hexagonal and cubic crystals separated by highly defected stacking fault regions.
Figure 2:
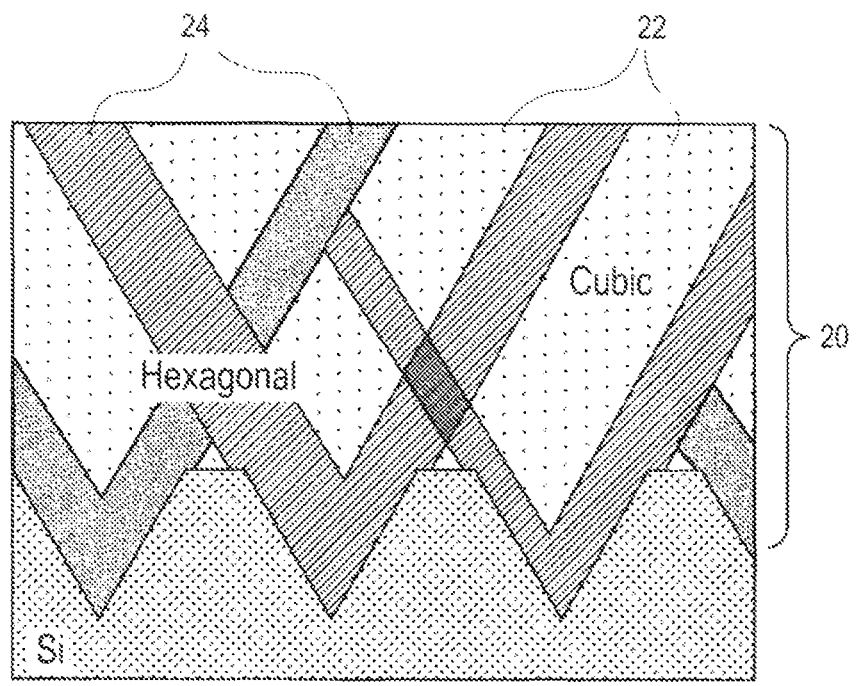
FIG. 2 is a material phase map of a cross section of an XTEM image of a 600-nm thick GaN sample grown on a V-shaped grooved silicon surface.

As depicted in FIG. 1, a cubic phase (10) at the inner side of an epilayer (not shown) can be formed through the transition from the initially nucleated hexagonal phases (14) which preferentially nucleate on the opposing {111} sidewalls of each V-shaped groove. The transition to the cubic phase in the center of the groove structure is driven by the symmetry of the V-shaped groove structure. Accompanying the transition to the cubic phase, there is a region of stacking faults (essentially fluctuations between cubic and hexagonal phases localized to the boundary region). This region can also be removed in an optimized growth process. As a result, the presence of hexagonal phase at the outside of the cubic phase region is difficult to avoid. While those two phases shown in FIG. 1 are spatially separated at the nanoscale and microscale, they can result in a heterogeneous phase mixture at the macroscale. A corresponding example is depicted in FIG. 2, where a thick GaN layer (20) grown on an array of V-grooves consists of spatially separated but mixed cubic (22) and hexagonal phases (24). Such phase mixture in a single epilayer is not suitable for device applications. Also, the GaN epilayer in FIG. 1 has a nonplanar surface that is not adequate for device processing.

To provide an epilayer in accordance with an embodiment of the invention, the growth of an epilayer hexagonal phase can be suppressed to ultimately lead to a single phase, wide area epitaxial GaN film, as described below and depicted in the FIGS. Herein, "wide area" is intended to include an area considerably greater than the largest groove width for the first to second phase transformation and can be about tens of microns in minimum dimension. "Wide area" is also intended to include dimensions large enough for device fabrication applications and can include continuous sheets over a macroscopic scale, for example, millimeters to centimeters.

Various embodiments of the invention are described using the example of the formation of cubic phase, nitrogen-based period III-V semiconductor thin films. However, it will be realized that various nitrogen-based semiconductors and several different semiconductor substrates are applicable to the present invention. In this disclosure, as a specific example, GaN on V-grooved silicon (001) will be used for process description.

In general, various embodiments describe the fabrication process in two parts. First, a groove is formed within a substrate, along with an appropriate masking structure (described below) to allow segregation of the cubic-phase epitaxial layer. Various methods can be used to prepare a grooved substrate with {111} terminated walls in a silicon substrate, and various groove shapes can be provided. After forming the grooved substrate, the area of the cubic phase layer is increased by further growing the cubic phase crystal. Growth can be sufficient to provide either macroscopic regions for device fabrication or continuous films for further characterization and device processing. Further processing details are described below and depicted in FIGS. 3-5.

A first method for forming a grooved substrate and an overhang feature is depicted in FIGS. 3a-3e. While only one V-shaped groove (V-groove) is depicted in FIGS. 3a-3d, several adjacent grooves and overhang features can be formed simultaneously to result in the structure of FIG. 3e.

Figure 3A:
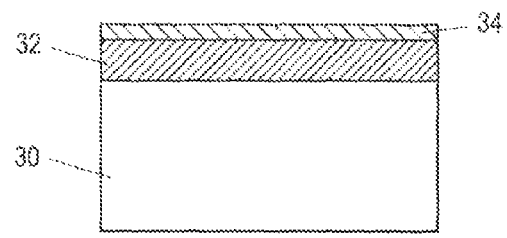
FIG. 3a is a cross section depicting one embodiment of a portion of a method illustrated more completely by FIGS. 3a-3e that can be used to form grooves and an overhang structure during the formation of an epilayer according to present teachings.

As depicted in FIG. 3a, a semiconductor wafer substrate assembly comprising at least an underlying layer 30 is provided. The underlying layer 30 can comprise a semiconductor wafer or an overlying silicon layer atop other material layers for example, silicon-on-insulator technology, etc. Other features may be present which are not individually depicted. A first material such as a first dielectric 32 and a second material such as a second dielectric 34 are formed over the surface of the wafer 30. The first and second materials and the underlying layer have the property that each material can be etched selective to the other two materials, for example using chemical wet or dry etching. The underlying layer 30 can comprise a semiconductor wafer having a (001) crystallographic orientation. Layers 32 and 34 can comprise any pair of dielectric films which have a dry and/or wet etching selectivity high enough to subsequently form an overhang structure between them. Materials such as silicon dioxide ($SiO_2$) and silicon nitride ($Si_xN_y$) each having a thickness less than or comparable to the groove width, for example ranging from sub-micrometer to several micrometers. The thickness of the dielectric layers should be sufficient to physically block the growth of hexagonal phase region for a given width of the final groove.

Figure 3B:
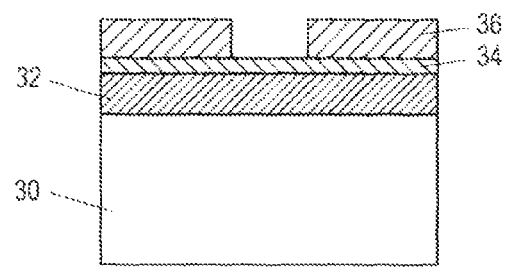
FIG. 3b is a cross section depicting a portion of the method of FIGS. 3a to 3e, according to an embodiment of the present teachings.

As depicted in FIG. 3b, a patterned photoresist layer 36 is formed to provide a periodic stripe pattern parallel to the {110} planes of the substrate on the film stack with lithography and dry/wet etching through the first and second dielectric layers. As an example, the opening in the photoresist can have a width ranging from sub-micrometer (e.g., tens of nanometers) to several micrometers, and adjacent openings (not depicted) also can have a similar length scale.

Figure 3C:
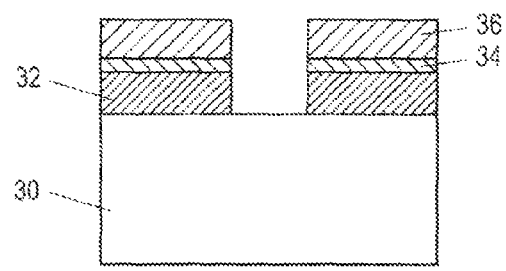
FIG. 3c is a cross section depicting a portion of the method of FIGS. 3a to 3e, according to an embodiment of the present teachings.
Figure 3D:
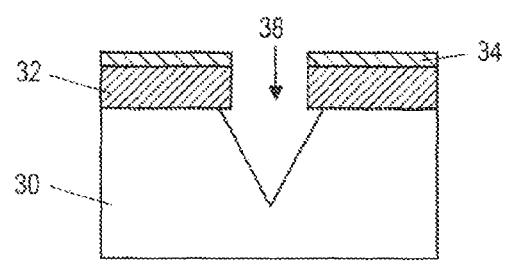
FIG. 3d is a cross section depicting a portion of the method of FIGS. 3a to 3e, according to an embodiment of the present teachings.

Next, the second dielectric layer 34 and the first dielectric layer 32 can be etched to expose the underlying layer 30 as depicted in FIG. 3c. The photoresist 36 can be removed, and the underlying layer 30 is etched to form a groove, such as the V-groove 38 depicted in FIG. 3d. The periodic grooves 38 can comprise {111} sidewalls along the pattern direction into the substrate when formed with anisotropic wet etching, for example, using well known processes with potassium hydroxide (KOH) and other chemical etchants which exhibit strongly crystal orientation dependent etch rates.

Figure 3E:
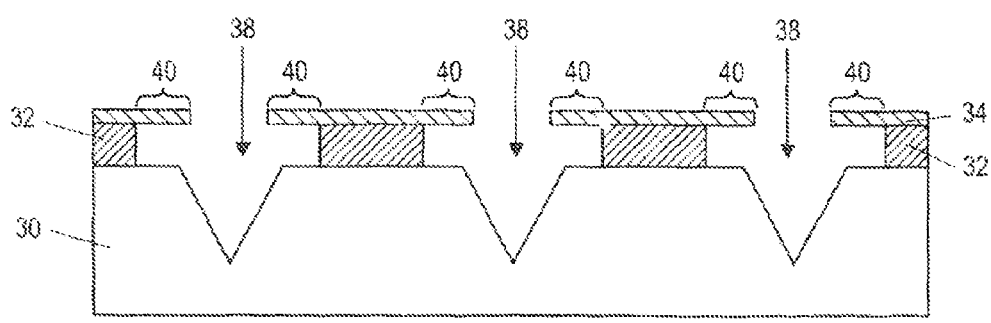
FIG. 3e is a cross section depicting a portion of the method of FIGS. 3a to 3e, according to an embodiment of the present teachings.

Next, the first dielectric layer 32 is etched selective to the second dielectric layer 34 and to the underlying layer 30, for example using a wet etch, to undercut the second dielectric layer 34 and to result in the overhang features 40 formed from the second dielectric layer 34 as depicted in FIG. 3e. The undercut of the second dielectric layer 34 results in an opening in the first dielectric layer which has a width wider than the opening in the second dielectric layer, and thus results in the overhang features. It should be noted that FIG. 3e depicts a wider view of the substrate, and thus a plurality of adjacent grooves and overhang structures formed simultaneously with the single groove of prior FIGS. 3a-3d.

It will be realized that variations in this process can be used to vary the dimensions of the overhang. Additionally, the order of the process can be altered, for example by undercutting the second dielectric layer 34 prior to forming the V-groove. These variations will be apparent to one of ordinary skill in the art and are within the scope of the present invention.

A second method for forming a V-shaped groove is depicted in FIGS. 4a-4e. This second method can be used particularly when a first material layer and a second material layer can be etched selective to the underlying layer (i.e. a silicon wafer or other silicon layer having a (001) crystallographic orientation). With this embodiment, selectivity between the first and second material layers, for example first and second dielectric layers, is not required.

Figure 4A:
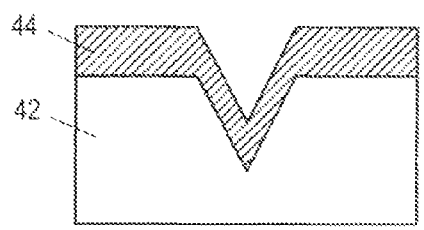
FIG. 4a is a cross section depicting an embodiment of a portion of a method illustrated by FIGS. 4a-4e that can be used to form grooves and an overhang structure during the formation of an epilayer, according to the present teachings.

In this embodiment, a structure similar to that depicted in FIG. 4a can be provided, which comprises an underlying layer 42 having grooves such as V-grooves, one of which is depicted. V-grooves can be etched into a silicon layer using a photoresist and/or hard mask having openings therein which provide a pattern for an isotropic (wet) etch of the underlying layer 42. The V-grooves can comprise {111} type sidewalls into the silicon (001) substrate. After forming the grooves, the silicon surface can be oxidized to form an $SiO_2$ layer 44, or a conformal layer can be deposited. An alternate method can comprise the deposition of a dielectric film on a V-grooved surface to form layer 44.

Figure 4B:
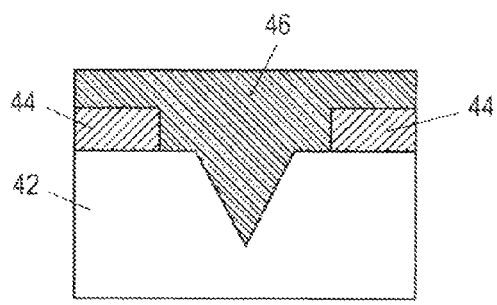
FIG. 4b is a cross section depicting a portion of the method of FIGS. 4a to 4e, according to an embodiment of the present teachings.

Next, a patterned photoresist layer (not depicted) is formed over the first dielectric layer 44 and the first dielectric layer is etched to expose the underlying layer 42. The photoresist layer is aligned with the groove to provide an opening such that the dielectric layer 44 can be removed from the groove and from a location on either side of the groove as depicted in FIG. 4b. A blanket planarization layer 46, for example a material such as polyimide, polymethyl methacrylate, antireflection coating material, etc., is formed to cover the exposed surface of the underlying layer 42 and to fill the opening in, and cover the surface of, the first dielectric layer 44 as depicted in FIG. 4b.

Figure 4C:
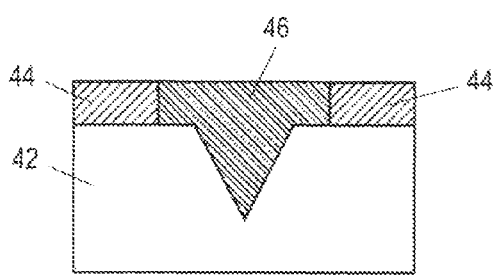
FIG. 4c is a cross section depicting another embodiment of a portion of the method of FIGS. 4a to 4e, according to an embodiment of the present teachings.

Next, the planarization layer 46 is etched, for example using chemical mechanical polishing (CMP), a wet etch, or a dry etch to remove the planarization layer 46 from the upper surface of the first dielectric layer 44 to result in the FIG. 4c structure. While the thickness of the first dielectric layer 44 may be reduced during this etch, removal of layer 44 should be minimized during removal of planarization layer 46. As will be understood by one of ordinary skill in the art, the leveling between layer 44 and layer 46 need only be approximate and does not need to be as precise as shown in the figure.

Figure 4D:
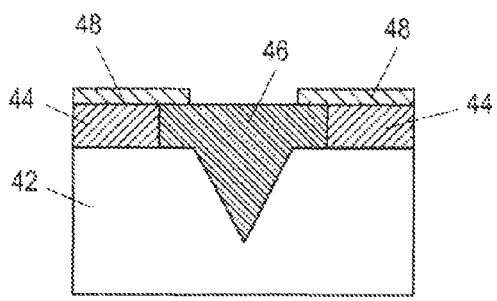
FIG. 4d is a cross section depicting another embodiment of a portion of the method of FIGS. 4a to 4e, according to an embodiment of the present teachings.

A second material layer 48, such as a second dielectric layer, is formed on the exposed surfaces of the first dielectric layer 44 and the planarization layer 46. The second dielectric layer 44 is patterned, for example using a photolithographic process, to expose the planarization layer 46 as depicted in FIG. 4d. The remaining planarization layer 46 is removed through the opening in the second dielectric layer to result in the structure of FIG. 4e, which can be a structure similar or identical to that depicted in FIG. 3e and has similar overhang structures 40. It should be noted that FIG. 4e depicts a wider view of the substrate, and thus a plurality of adjacent grooves and overhang structures 40 formed simultaneously with the single groove of prior FIGS. 4a-4d.

The process of FIGS. 3a-3e and 4a-4e are performed to provide a grooved silicon (001) substrate structure upon which a cubic phase, nitrogen-based compound semiconductor film can be epitaxially grown. As discussed, other methods for forming the structure are contemplated. For example, a method comprising laser ablation of the substrate and separate formation of the mask layer is contemplated. The text below describes the method for forming the cubic phase epilayer upon a substrate structure similar to that depicted in FIGS. 3e and 4e.

Figure 4E:
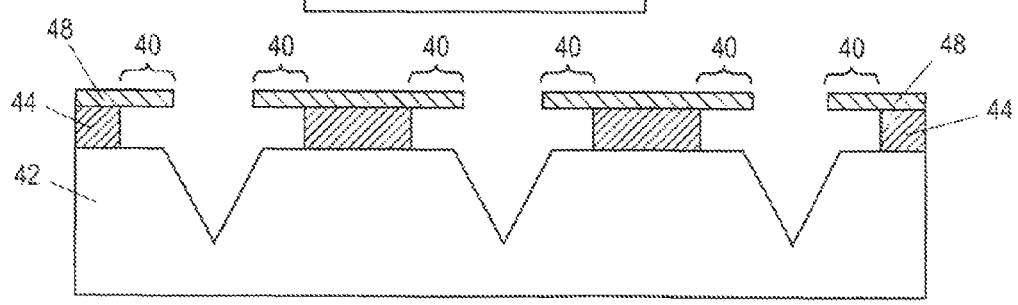
FIG. 4e is a cross section depicting another embodiment of a portion of the method of FIGS. 4a to 4e, according to an embodiment of the present teachings.
Figure 5A:
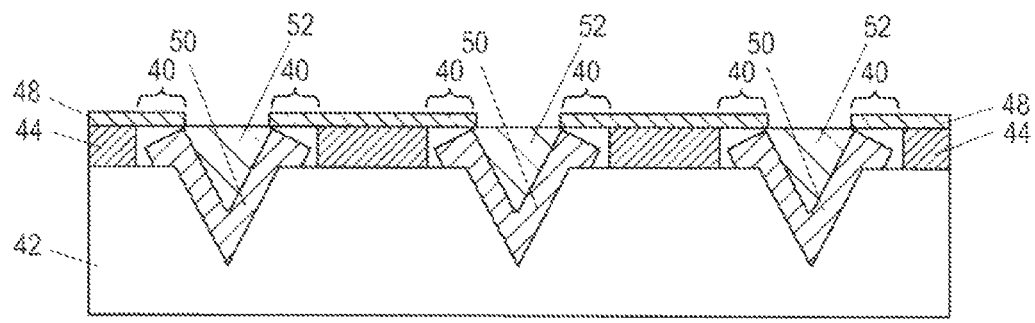
FIG. 5a is a cross section depicting an embodiment of a portion of a method of FIGS. 5a-5i that is used to form an epitaxially grown, cubic phase epilayer on a grooved silicon substrate, according to present teachings.

For this part of the process, the exemplary structure of FIG. 4e is cleaned and loaded into an epitaxy reactor. As depicted in FIG. 5a, a semiconductor epilayer, for example GaN or a related aluminum gallium indium nitride (AlGaInN) semiconductor, is deposited on the patterned substrate. A selective growth mode, established by adjustment of reactant fluxes, temperature, and other growth conditions, is used to form an epilayer comprising a hexagonal (wurzite) phase 50 and a cubic phase 52. The selective growth mode results in growth of the epilayer from only each opposing grooved silicon <111> surface. As the hexagonal epilayer wet etch, through the openings 60 in the third dielectric lay which functions as a mask layer to block hexagonal phase epitaxial growth and allows cubic epitaxial growth through the opening to provide the epilayer 50 as depicted in FIG. 5b.

In one exemplary embodiment, the semiconductor wafer substrate assembly of FIG. 4e is placed into an epitaxy reactor, and material deposition, for example GaN, can be performed. Formation of the material can be performed using typical growth conditions of metalorganic vapor phase epitaxy, or under selective growth conditions of molecular beam epitaxy. Other growth conditions of materials such as the GaN specified can also be performed.

The epilayer deposition can be continued until only the cubic phase region 52 extends through the opening in each second dielectric layer 48. The second dielectric layer 48 thus functions as a stripe mask, as depicted in FIG. 5b. The deposition is stopped before the top, flat (001) facet 54 at the top of the cubic phase region 52 disappears as a result of dynamical crystal faceting during growth.

Figure 5B:
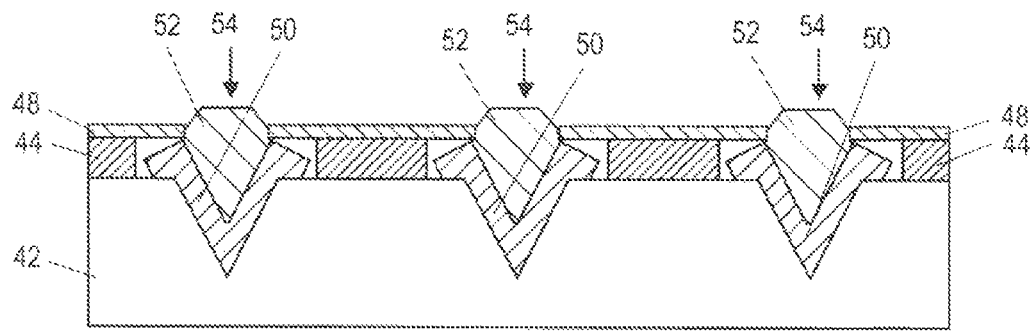
FIG. 5b is a cross section depicting another embodiment of a portion of the method of FIGS. 5a to 5i, according to an embodiment of the present teachings.
Figure 5C:
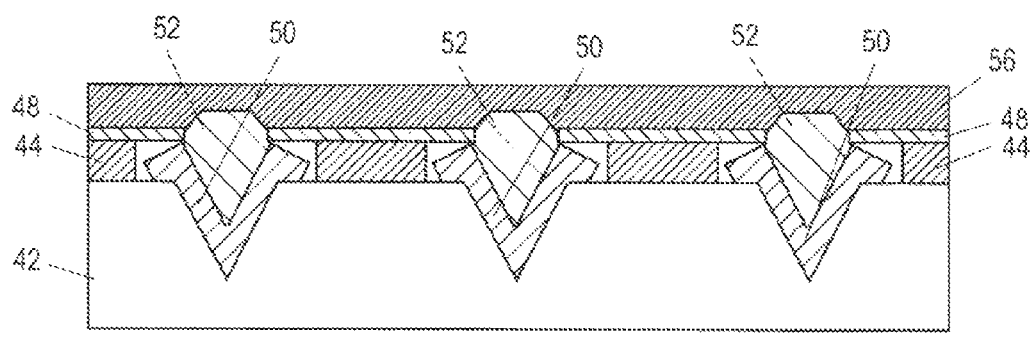
FIG. 5c is a cross section depicting another embodiment of a portion of the method of FIGS. 5a to 5i, according to an embodiment of the present teachings.
Figure 5D:
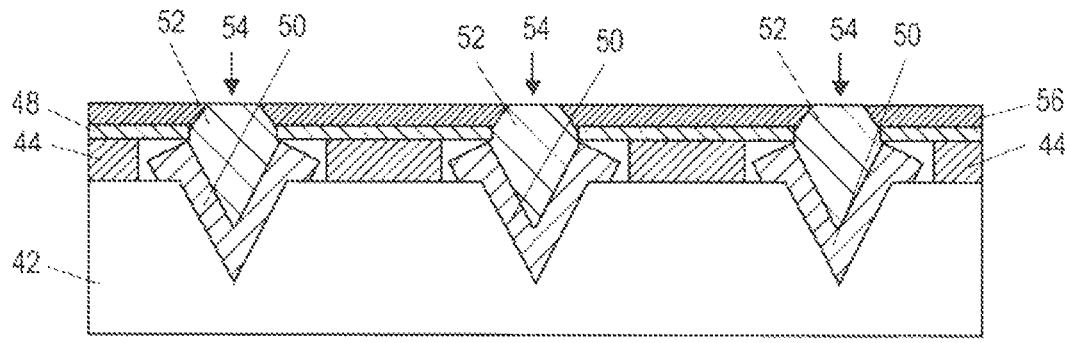
FIG. 5d is a cross section depicting another embodiment of a portion of the method of FIGS. 5a to 5i, according to an embodiment of the present teachings.

After forming a structure similar to that depicted in FIG. 5b, the wafer structure is removed from the epitaxy reactor and the front surface is covered with a planarization material 56 such as polyimide or antireflection coating material to result in the structure of FIG. 5c. The planarization material 56 can be thick enough to completely cover the part of 52 grown above layer 48. Subsequently, the planarization material 56 is uniformly removed, for example by planarizing such as by CMP, or by using an etch such as dry etching. The etch can be stopped once the top (001) facet 54 of the cubic phase epilayer 52 is exposed and level with an upper surface of the planarization material 56, as depicted in FIG. 5d.

Figure 5E:
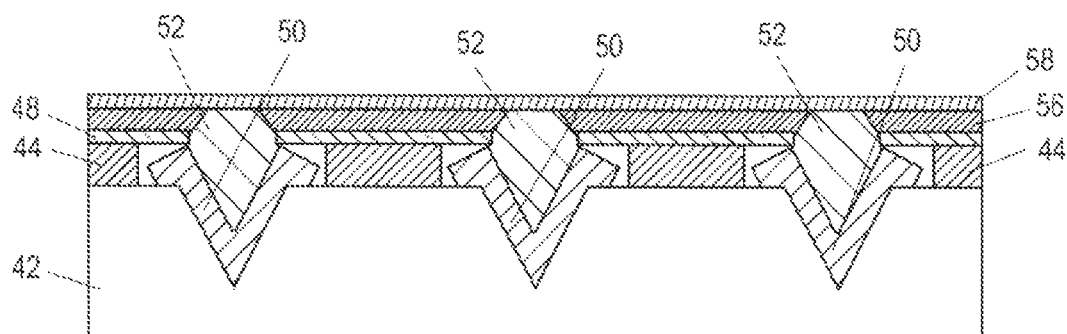
FIG. 5e is a cross section depicting another embodiment of a portion of the method of FIGS. 5a to 5i, according to an embodiment of the present teachings.
Figure 5F:
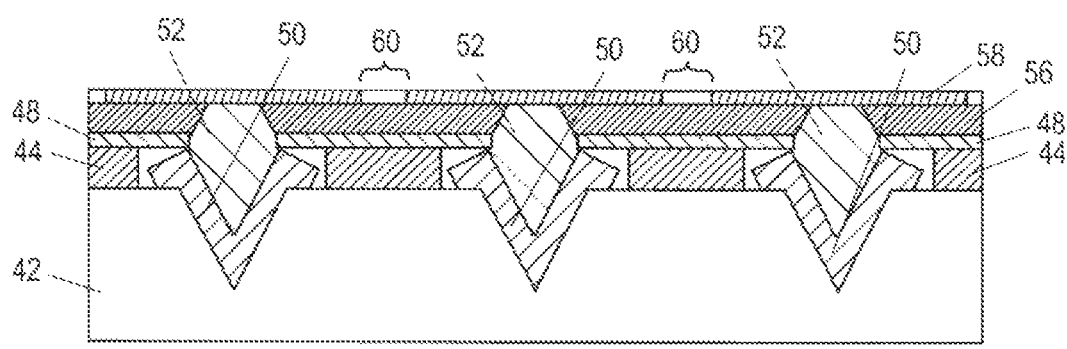
FIG. 5f is a cross section depicting another embodiment of a portion of the method of FIGS. 5a to 5i, according to an embodiment of the present teachings.

Next, a third material layer 58, such as a third dielectric layer, is deposited over the upper surface of the exposed top facet 54 and over the exposed planarization layer 56 as depicted in FIG. 5e. This material can be formed to physically contact both the cubic phase epilayer 52 and the planarization layer 54. Using a process such as photolithography, an array of openings 60 is etched into the third dielectric layer 58 as depicted in FIG. 5f. In this embodiment, openings 60 are formed at a location away from the regions of the crystal structure 50, 52. Various hole arrays are available, for example one-dimensional stripe arrays either parallel or perpendicular to the grooves, or two-dimensional hole arrays. For mechanical stability of the third dielectric layer 58 during subsequent processing, a two-dimensional hole array would be desirable.

The planarization layer 56 which is interposed between the second dielectric layer 48 and the third dielectric layer 58 is etched, for example using a wet etch, through the openings 60 in the third dielectric layer 58. The dimensions of the holes etched into the third dielectric layer 58 can vary based on the application. The holes provide access for both etchants and growth species to allow further processing and growth. The third dielectric layer thus functions as a mask layer. To facilitate the most desirable formation of a subsequent cubic phase layer, the planarization layer 56 is removed as completely as possible. Removal of planarization layer 56 is selective to the third dielectric layer 58, the second dielectric layer 48, and the cubic phase layer 52, as well an any additional structures which are exposed to the etch material. For this particular embodiment, a wet etch comprising a hot base or a "piranha" etchant (i.e. a mixture of sulfuric acid and hydrogen peroxide) would function sufficiently. This results in the structure of FIG. 5g, which now comprises a space 62 between the second dielectric layer 48 and the third dielectric layer 58.

Figure 5G:
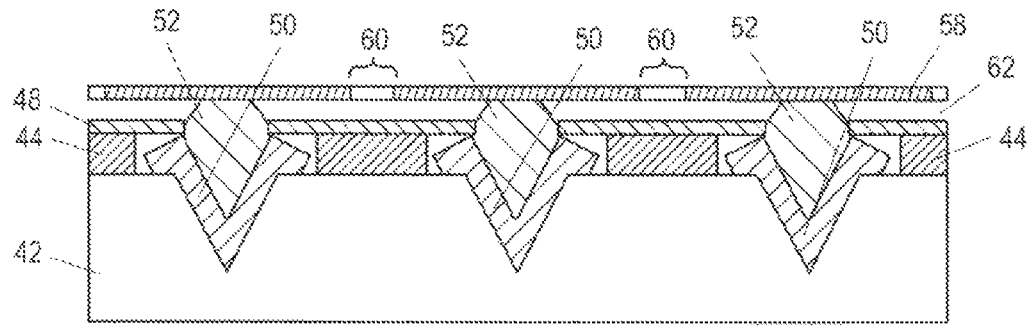
FIG. 5g is a cross section depicting another embodiment of a portion of the method of FIGS. 5a to 5i, according to an embodiment of the present teachings.
Figure 5H:
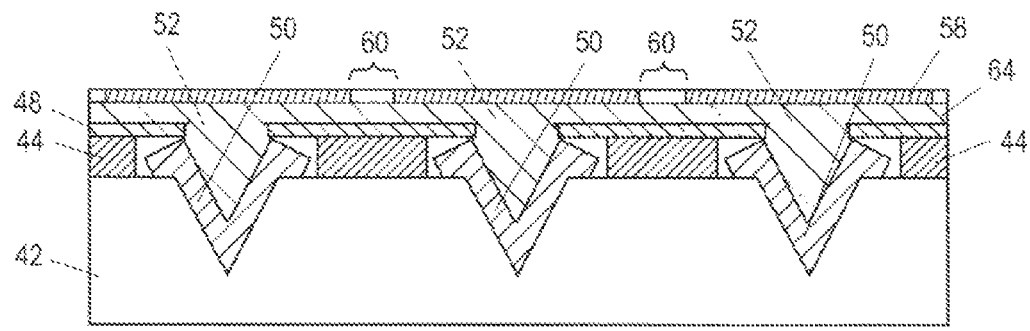
FIG. 5h is a cross section depicting another embodiment of a portion of the method of FIGS. 5a to 5i, according to an embodiment of the present teachings.

After forming the structure of FIG. 5g, cubic phase epitaxy can be continued to deposit an epilayer on the patterned surface of the substrate using selective growth mode. As the deposition progresses, lateral growth from the side facets of the epilayer 52 proceeds through the space 62 between the second dielectric layer 48 and the third dielectric layer 58 to form cubic phase epitaxial layer 64 as depicted in FIG. 5h. Crystal growth can be terminated once the epilayer islands are of sufficient size for the intended application, or until coalescence between the adjacent epilayers occurs to form a single, continuous layer which completely fills space 62 as depicted.

Figure 5I:
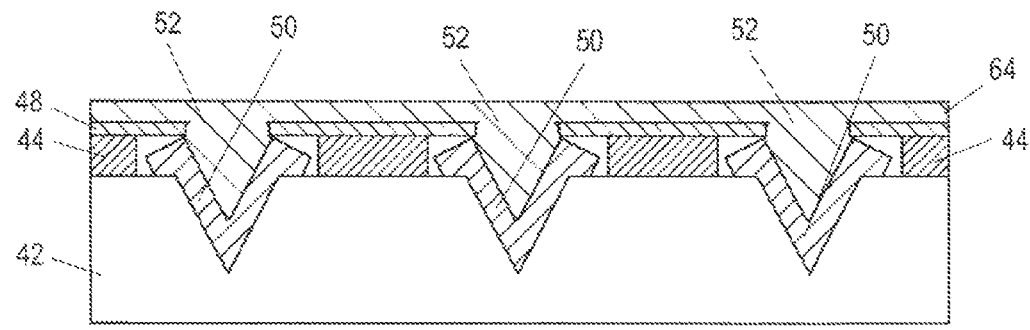
FIG. 5i is a cross section depicting another embodiment of a portion of the method of FIGS. 5a to 5i, according to an embodiment of the present teachings.

Next, the semiconductor wafer substrate assembly is unloaded from the epitaxy reactor, and the third dielectric layer 58 is removed to expose the wide-area cubic phase semiconductor film (or island film, if crystal growth is not continued until complete coalescence results) formed on the silicon (001) substrate as depicted in FIG. 5i. In this embodiment, the cubic phase material forms a solid sheet which extends over an upper surface of the second material layer 48 which comprises the mask layer, such that the overhang structure 40 is interposed between the cubic phase material 64 and the substrate 42. As is also depicted, the overhang structure is also interposed between the hexagonal phase material 50 and the cubic phase material 62. Further, the hexagonal phase material 50 forms and is interposed only between the substrate 42 and the mask layer 44, 48, while the cubic phase material extends through the opening in the mask layer and continues to grow over the upper surface of the mask layer. After forming the structure of FIG. 5i, subsequent processing can then continue, for example to form other device features or to complete a functional semiconductor device.

Another embodiment for forming a wide-area cubic phase semiconductor film is depicted in FIGS. 5b and 6a-6c. This process comprises the use of dynamical faceting during growth. In this process, the cross sectional shape of an epilayer grown on a one-dimensional stripe opening can be regarded as a quasi-two dimensional crystal.

Figure 6A:
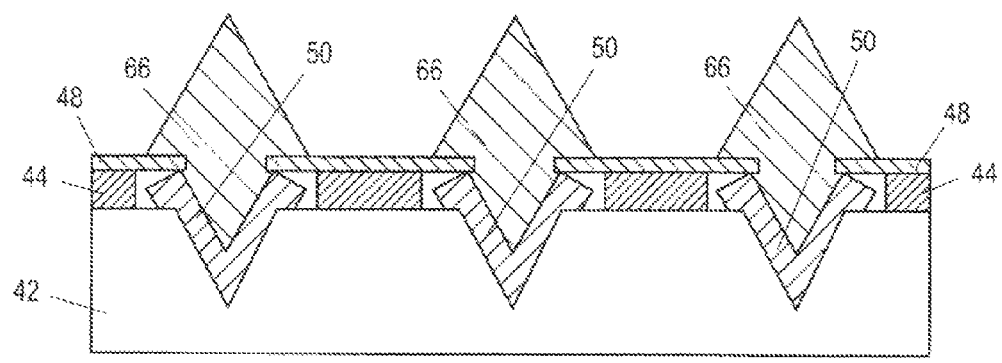
FIG. 6a is a cross section depicting a portion of a method illustrated by FIGS. 6a to 6c that is used to form an epitaxially grown, cubic phase epilayer on a grooved silicon substrate, according to an embodiment of the present teachings.
Figure 6B:
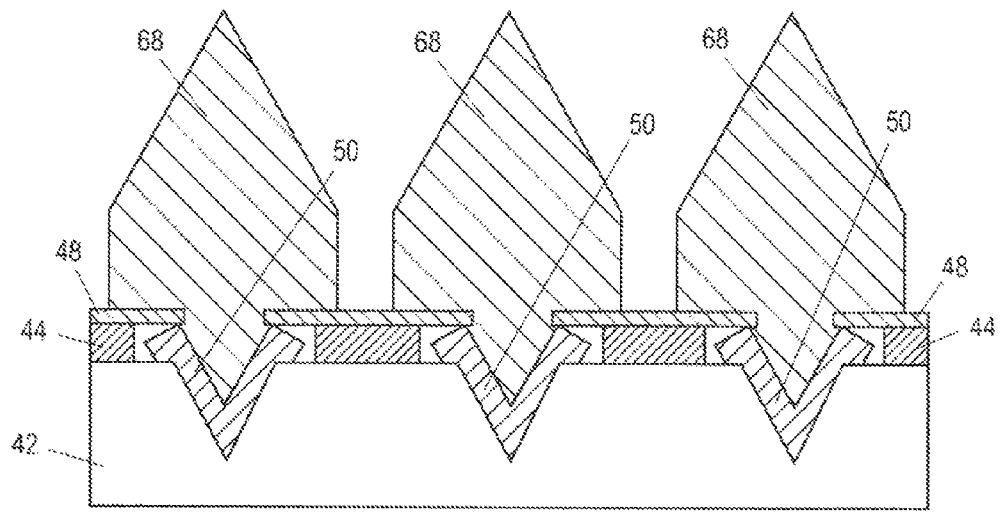
FIG. 6b is a cross section depicting another embodiment of a portion of the method of FIGS. 6a to 6c, according to an embodiment of the present teachings.
Figure 6C:
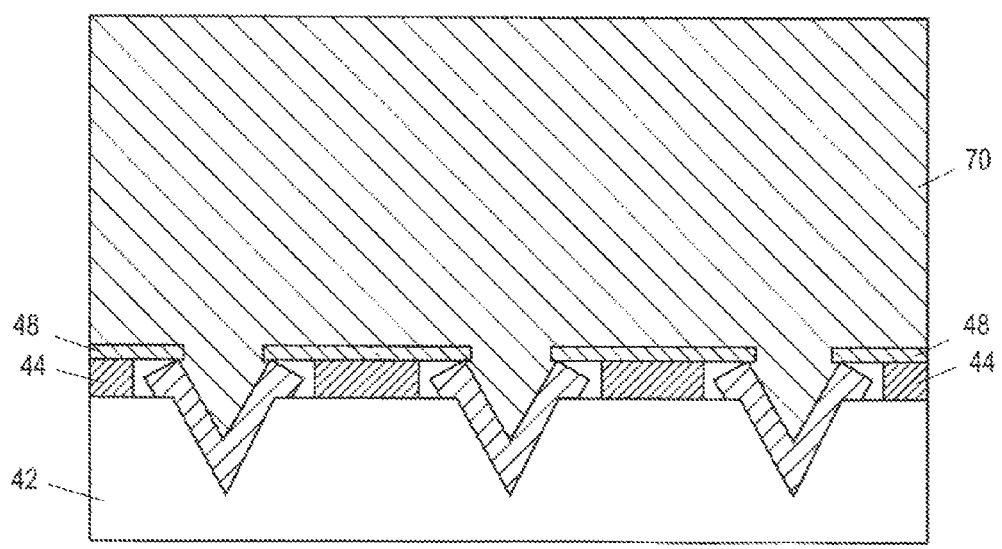
FIG. 6c is a cross section depicting another embodiment of a portion of the method of FIGS. 6a to 6c, according to an embodiment of the present teachings.

Depending on growth conditions, the epitaxy on the patterned substrate as depicted in FIG. 5b can be caused to form in a manner similar to that depicted in FIGS. 6a-6c. This may result in a much thicker cubic phase epitaxial layer deposition that that depicted in FIG. 5i, but may ultimately provide a more planar surface than that which results from the previously described processes. At this time, it is unknown whether defects will result at the coalescence boundaries in either of these techniques, but the defect density is expected to be significantly lower than that of the coalescence of nanowires since the pattern used in this disclosure is one-dimensional and the period of the grooves can be enhanced to micrometer range. One result can be a reduced interface or boundary area in coalescence, which may lead to a lower defect density.

FIGS. 3 to 6 schematically depict various process flows which result in wide-area cubic phase GaN. As depicted in FIG. 3e, for example, an overhang structure 40 is fabricated over each groove using the first material layer 32 and the second material layer 34. The mask films employed to anisotropically etch the groove block the growth of a subsequently formed hexagonal phase region, while allowing the continual growth of a cubic phase region which is physically filtered from the epilayer as growth proceeds. If GaN is selectively deposited on this V-groove, it will have the same phase distribution in cross sectional view, as shown in FIGS. 1 and 2. Owing to the overhang structure, however, the hexagonal phase formed at both ends of an epilayer and the defected, stacking fault region, between the hexagonal and cubic phases cannot extend over each V-groove. In other words, the mask layer plays a role of a barrier which physically blocks the extended growth of the hexagonal phase region out of the V-groove. The overhang structure also can block the propagation of defects such as misfit dislocations and stacking faults, and contribute to the relief of excess strain energy due to the lattice mismatch between GaN and Si.

In continued deposition as depicted in FIGS. 6a-6c, the window in second dielectric layer 48 which provides the overhang structure allows only the cubic phase region 66 in the middle of the epilayer to grow, as depicted in FIG. 6b. An epilayer selectively grown on a one dimensional stripe opening generally has a (001) facet at its top at the initial stage of growth. In FIG. 5b, growth must be precisely controlled so that the top (001) facet 54 of GaN grown in each V-groove is kept wide enough for the planarization and to provide mechanical stability for the third dielectric layer 58 (FIG. 5g, for example). The planarization process shown in FIG. 5d is also critical. As shown in 5e to 5g, the third dielectric layer 58 deposited after planarization of layer 56 at FIG. 5d is employed to both remove the remaining planarization material 56 and to provide a space 62 (FIG. 5g) between the second dielectric layer 48 and the third dielectric layer 58 for guiding lateral growth. For these purposes, various patterns for the perforation (openings 60) into the third dielectric layer 58 can be employed. For example, a one-dimensional array of stripe openings either parallel or perpendicular to the grooves can be used. In the alternative, a two-dimensional hole array can be used. In continued growth at FIGS. 5g and 5h, every space between the second and third dielectric layers is filled with cubic phase GaN by lateral growth, up to coalescence with neighboring cubic phase regions. Such coalescence results in a flat top surface over the entire surface and provides a wide-area cubic phase GaN on a silicon (001) substrate. Also, the coalescence provides an opportunity for defect quenching or nucleation and strain relief.

An alternative embodiment (not shown) can alter the epitaxial growth conditions once the pattern of FIG. 5b is achieved to encourage lateral growth over the mask layer 48 as is done in hexagonal growth using a lateral epitaxial overgrowth (LEO) process. LEO of the hexagonal material can reduce the impact of the lattice mismatch between the substrate and the epitaxial layer.

With regard to the process of FIGS. 6a-6c, the sidewall of the cubic GaN epilayer 52 in FIG. 5b could be silicon {111}-A or silicon {111}-B type, depending on growth conditions. Then, continued growth in FIG. 5b without planarization and third dielectric layer deposition can result in the facet evolution depicted in FIGS. 6a-6c. FIG. 6a results from continued cubic phase growth of material 52 at FIG. 5b to form cubic phase growth 66. Further growth results in increasingly large cubic crystal structures 68 at FIG. 6b by vertical and lateral overgrowth, which finally induces coalescence between adjacent epilayers and formation of a single layer cubic phase structure 70 as depicted in FIG. 6c, which comprises a planar top surface.

Binary semiconductors have many possible defects such as antiphase boundaries in nucleation and coalescence. However, nitrogen-based semiconductors are less sensitive to defects in device performance, as compared with other III-V semiconductors. The process of FIGS. 5b and 6a-6c requires a single growth step, while the process of FIGS. 5a-5i uses two separate growth steps with intermediate processing (and thus has more possibilities for contamination). Thus, a single crystal growth process can be simpler than a process which uses two separate growth stages, but also requires a thicker growth. The process selected depends on the particular use of the layer and the details of the defect/contamination incorporation. Additionally, the resulting impact on device performance and reliability for these two processes as well as the particular processing conditions which may result in defect mechanisms will need to be considered.

Figure 7:
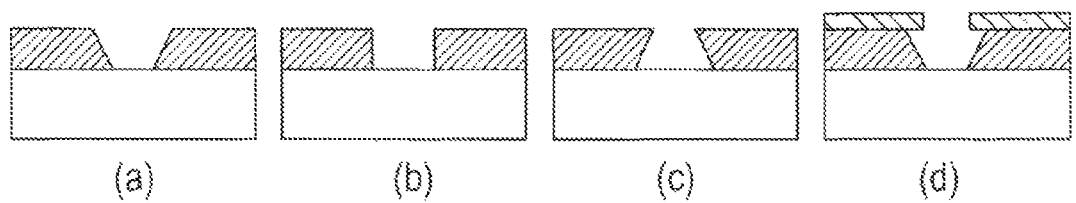
FIG. 7 shows cross sections depicting various patterned mask layers which that can be used to form grooves of various configurations within an underlying substrate, according to embodiments of the present teachings.
Figure 8:
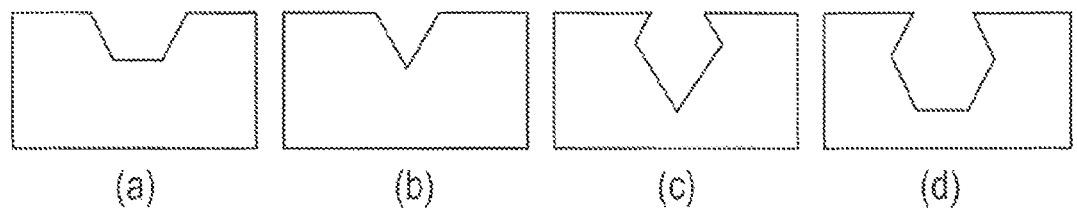
FIG. 8 shows cross sections depicting various groove patterns that can be formed in a substrate such as a silicon substrate prior to forming an epilayer, according to embodiments of the present teachings.

FIG. 7 depicts several possible profiles of the mask layers which can be used for cubic phase GaN on a single groove of a silicon (001) substrate. FIG. 8 presents various possible profiles of the grooves fabricated into a substrate for the same purpose. Different etching techniques can provide different etch profiles but, depending on materials and growth conditions, most of the combinations of the mask and groove profiles shown in FIGS. 7 and 8 can be employed for the cubic phase GaN on a single groove. Profile 7(d) is similar to the mask layers for the overhang structure which is the most straightforward for the present embodiment of the invention. One or more of the structures depicted in FIGS. 7 and 8 would be applicable to the various processes described above for wide-area, cubic phase GaN on a silicon (001) substrate.

In particular the structures of FIG. 7(a)-(c) are attractive since they involve only a single mask material. In these embodiments the mask material can be sufficiently thick to block the hexagonal growth phase along with the defected transition regions between the first hexagonal growth phase and the second cubic growth phase.

To form the grooves in the semiconductor substrate of the previous embodiments and in FIG. 8, a mask can be aligned in a direction parallel with the {110} crystal lattice plane (crystal direction) of the substrate, such as a silicon substrate. The exposed semiconductor substrate can then etched through the mask, for example using anisotropic etching, to expose the {111} crystal lattice planes or crystal faces of the semiconductor substrate on opposing sides of the groove, which provides the surface from which the crystal phase GaN grows.

In addition to the various described embodiments formed on a silicon substrate, other semiconductor substrates which have a cubic symmetry sufficient to provide a groove comprising {111}-type sidewalls are also contemplated.

When used to form a functional semiconductor device, additional processing stages can be performed, for example after forming the crystal structure of FIGS. 5i and 6c, such as additional growth and processing, pn junction formation, quantum well formation, cleaved facets, and/or other processing to form a completed semiconductor device.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
a silicon-on-insulator substrate comprising a silicon layer over an insulating layer;
a plurality of grooves within the silicon layer;
a mask structure comprising a plurality of openings therein over the silicon layer, wherein the plurality of openings in the mask structure are aligned with the plurality of grooves;
an epitaxial layer in each of the plurality of grooves in the silicon layer, wherein the epitaxial layer comprises hexagonal phase material and cubic phase material, the cubic phase material extending through each of the plurality of openings in the mask structure, growth of the hexagonal phase material having been blocked by the mask structure in a manner so that the hexagonal phase material does not extend above the mask structure.

2. The semiconductor device of claim 1, wherein the mask comprises substantially vertical sidewalls.

3. The semiconductor device of claim 1, wherein the mask comprises inclined sidewalls with a sufficient incline to block the growth of the hexagonal phase material above the masking structure.

4. The semiconductor device of claim 1, wherein the cubic phase material is coalesced to form a wide area film.

5. The semiconductor device of claim 1, wherein the cubic phase material forms a plurality of island films.

6. The semiconductor device of claim 1, where the silicon layer of the silicon-on-insulator substrate is oriented to a (001) silicon facet.

7. The semiconductor device of claim 6, where the grooves comprise sidewalls of opposing {111} crystal planes of the silicon layer.

8. The semiconductor device of claim 1, wherein the mask structure is formed from a single material.

9. A semiconductor device, comprising:
a silicon-on-insulator substrate comprising a silicon layer over an insulating layer;
a plurality of grooves within the silicon layer where the grooves are formed with two opposing faces and with a bottom face that is parallel to the initial face of the silicon layer;
a mask structure comprising a plurality of openings therein over the silicon layer, wherein the plurality of openings in the mask structure are aligned with the plurality of grooves;
an epitaxial layer in each of the plurality of grooves in the silicon layer, wherein the epitaxial layer comprises hexagonal phase material and cubic phase material, the cubic phase material extending through each of the plurality of openings in the mask structure, growth of the hexagonal phase material having been blocked by the mask structure in a manner so that the hexagonal phase material does not extend above the mask structure.

10. The semiconductor device of claim 9, wherein the mask comprises substantially vertical sidewalls.

11. The semiconductor device of claim 9, wherein the mask comprises inclined sidewalls with a sufficient incline to block the growth of the hexagonal phase material above the masking structure.

12. The semiconductor device of claim 9, wherein the cubic phase material is coalesced to form a wide area film.

13. The semiconductor device of claim 9, wherein the cubic phase material forms a plurality of island films.

14. The semiconductor device of claim 9, where the silicon layer of the silicon-on-insulator substrate is oriented to a (001) silicon facet.

15. The semiconductor device of claim 14, where the grooves comprise sidewalls of opposing {111} crystal planes of the silicon layer.

16. The semiconductor device of claim 9, wherein the mask structure is formed from a single material.

* * * * *